(12) United States Patent
Kim et al.

(10) Patent No.: US 10,134,713 B2
(45) Date of Patent: Nov. 20, 2018

(54) SEMICONDUCTOR PACKAGE

(71) Applicant: SAMSUNG ELECTRONICS CO., LTD., Suwon-si, Gyeonggi-do (KR)

(72) Inventors: Kwang-seok Kim, Suwon-si (KR); Sun-won Kang, Seongnam-si (KR); Il-joon Kim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/815,042

(22) Filed: Nov. 16, 2017

(65) Prior Publication Data
US 2018/0145054 A1 May 24, 2018

(30) Foreign Application Priority Data
Nov. 18, 2016 (KR) .................. 10-2016-0154452

(51) Int. Cl.
*H01L 25/065* (2006.01)
*H01L 23/64* (2006.01)
(Continued)

(52) U.S. Cl.
CPC .... *H01L 25/0657* (2013.01); *H01L 23/49811* (2013.01); *H01L 23/49822* (2013.01); *H01L 23/49838* (2013.01); *H01L 23/647* (2013.01); *H01L 24/17* (2013.01); *H01L 24/49* (2013.01); *H01L 25/0655* (2013.01); *H01L 2225/0651* (2013.01); *H01L 2225/06513* (2013.01); *H01L 2225/06517* (2013.01)

(58) Field of Classification Search
CPC ... H01L 25/0657; H01L 24/49; H01L 23/647; H01L 25/0655; H01L 24/17; H01L 23/49822; H01L 23/49838; H01L 23/49811; H01L 2225/06513; H01L 2225/0651; H01L 2225/06517
See application file for complete search history.

(56) References Cited

U.S. PATENT DOCUMENTS 5,574,415 A 11/1996 Peterson
6,125,419 A 9/2000 Umemura et al.
(Continued)

FOREIGN PATENT DOCUMENTS

| JP | 3344685 | 12/1997 |
| KR | 10-0689967 | 2/2007 |
| KR | 10-2009-0019523 | 5/2009 |

*Primary Examiner* — Karen Kusumakar
(74) *Attorney, Agent, or Firm* — Lee & Morse, P.C.

(57) ABSTRACT

A semiconductor package includes a printed circuit board, a resistor circuit, and first and second semiconductor chips. First and second pads are on a first surface of the printed circuit board, and external connection terminal is on a second surface of the printed circuit board. The resistor circuit has a first connection terminal connected to the first pad and a second connection terminal connected to the second pad. The first semiconductor chip is connected to the first pad and the second semiconductor chip is stacked on the first semiconductor chip and connected to the second pad. The printed circuit board includes a signal transfer line connecting a branch in the printed circuit board to the external connection terminal. A first transfer line connects the branch to the first pad. A second transfer line connects the branch to the second pad.

20 Claims, 16 Drawing Sheets

(51) Int. Cl.
  *H01L 23/498* (2006.01)
  *H01L 23/00* (2006.01)

(56) References Cited

U.S. PATENT DOCUMENTS

| | | | |
|---|---|---|---|
| 6,300,789 B1 | 10/2001 | Ball | |
| 6,362,525 B1* | 3/2002 | Rahim | H01L 23/49838 257/528 |
| 6,861,923 B2* | 3/2005 | Kolehmainen | H01P 5/16 333/117 |
| 7,646,212 B2 | 1/2010 | Sung et al. | |
| 7,893,526 B2 | 2/2011 | Mun et al. | |
| 8,436,446 B2 | 5/2013 | Ding et al. | |
| 9,349,713 B2* | 5/2016 | Kim | H01L 24/97 |
| 2006/0006516 A1* | 1/2006 | Funaba | G11C 5/04 257/686 |
| 2013/0168842 A1* | 7/2013 | Park | H01L 24/49 257/690 |

* cited by examiner

SEMICONDUCTOR PACKAGE

CROSS-REFERENCE TO RELATED APPLICATION

Korean Patent Application No. 10-2016-0154452, filed on Nov. 18, 2016, and entitled: "Semiconductor Package," is incorporated by reference herein in its entirety.

BACKGROUND

1. Field

One or more embodiments described herein relate to a semiconductor package.

2. Description of the Related Art

Electronic devices are designed to be smaller and with greater functionality. As a result, there is a demand for large-capacity and multi-functional semiconductor chips. These chips may be incorporated within various semiconductor packages.

SUMMARY

In accordance with one or more embodiments, a semiconductor package includes a printed circuit board having a lower surface and an upper surface, the upper surface including a first pad and a second pad; an external connection terminal on the lower surface of the printed circuit board; a resistor circuit including a first connection terminal and a second connection terminal, the first connection terminal connected to the first pad and the second connection terminal is connected to the second pad; a first semiconductor chip mounted on the printed circuit board and connected to the first pad; and a second semiconductor chip stacked on the first semiconductor chip and connected to the second pad, wherein the printed circuit board includes: a signal transfer line that connects a branch in the printed circuit board to the external connection terminal; a first transfer line that connects the branch to the first pad; and a second transfer line that connects the branch to the second pad.

In accordance with one or more other embodiments, a semiconductor package includes a printed circuit board including a lower surface and an upper surface, the upper surface including a first pad and a second pad; an external connection terminal on the lower surface of the printed circuit board; a resistor circuit including a first connection terminal and a second connection terminal, the first connection terminal connected to the first pad and the second connection terminal connected to the second pad; a first semiconductor chip mounted on the printed circuit board and connected to the first pad; and a second semiconductor chip mounted on the printed circuit board and connected to the second pad, the first semiconductor chip and the second semiconductor chip mounted on a same plane of the printed circuit board, wherein the printed circuit board includes: a signal transfer line that connects a branch in the printed circuit board to the external connection terminal; a first transfer line that connects the branch to the first pad; and a second transfer line that connects the branch to the second pad.

In accordance with one or more other embodiments, a semiconductor package includes a printed circuit board; a first semiconductor chip and a second semiconductor chip mounted on the printed circuit board; and a power distribution device mounted on the printed circuit board and including: an input terminal to receive a signal; a first output terminal and a second output terminal to output a signal; a resistor circuit including a first connection terminal connected to the first output terminal and a second connection terminal connected to the second output terminal; a signal transfer line that connects a branch in the power distribution device to the input terminal; a first transfer line that connects the branch to the first connection terminal; and a second transfer line that connects the branch to the second connection terminal.

In accordance with one or more other embodiments, a semiconductor package includes a printed circuit board; a first semiconductor chip on the printed circuit board; a second semiconductor chip on the first semiconductor chip; and a resistor circuit including a first connection terminal connected to a first output terminal and a second connection terminal connected to a second output terminal, wherein the resistor circuit has a Wilkerson divider structure.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
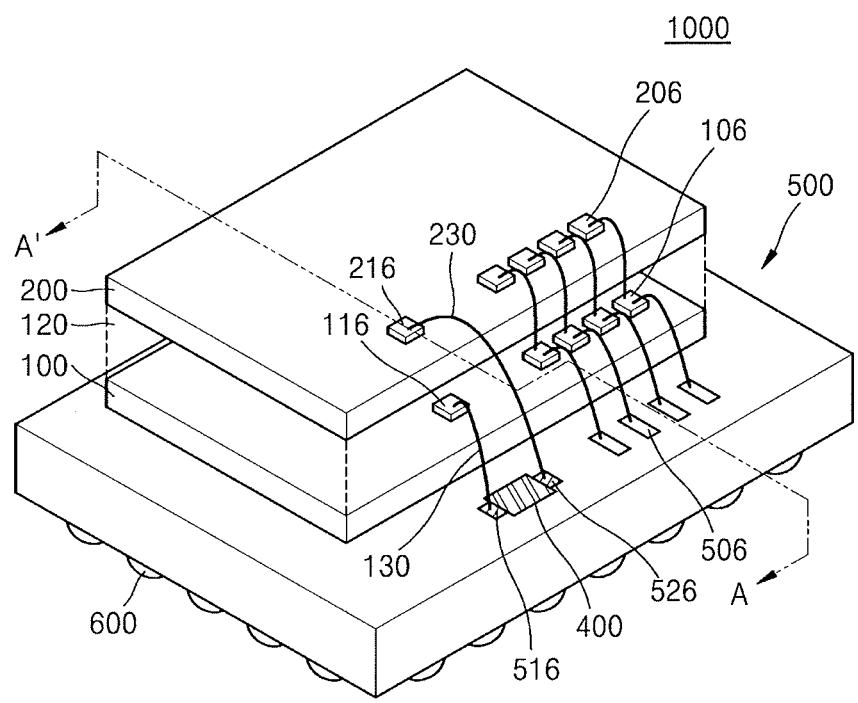
FIG. 1 illustrates an embodiment of a semiconductor package.

FIG. 1 illustrates an embodiment of a semiconductor package 1000 which may include a printed circuit board 500, a resistor unit 400, a first semiconductor chip 100, and a second semiconductor chip 200. The semiconductor package 1000 may further include external connection terminals 600 on a lower surface of the printed circuit board 500. A plurality of pads 516, 526, and 506 including a first pad 516 and a second pad 526 may be on an upper surface of the printed circuit board 500.

The first semiconductor chip 100 and the second semiconductor chip 200 are stacked on the printed circuit board 500 and may be sequentially mounted. The first semiconductor chip 100 has an upper surface which may include a plurality of pads 116 and 106. The second semiconductor chip 200 has an upper surface which may include a plurality of pads 216 and 206. In one example embodiment, the pads 116, 106, 216, and 206 may be on lower surfaces of the first semiconductor chip 100 and the second semiconductor chip 200.

The first semiconductor chip 100 and the second semiconductor chip 200 may be mounted on the printed circuit board 500, for example, by a wire bonding method. Therefore, the semiconductor package 1000 may include a first bonding wire 130 and a second bonding wire 230. The first bonding wire 130 may electrically connect the first pad 516 of the printed circuit board 500 to the first semiconductor chip 100. The second bonding wire 230 may electrically connect the second pad 526 of the printed circuit board 500 to the second semiconductor chip 200. In one example embodiment, the first semiconductor chip 100 and the second semiconductor chip 200 may be mounted on the printed circuit board 500, for example, by a flip-chip bonding method.

The first semiconductor chip 100 and the second semiconductor chip 200 may include semiconductor devices, e.g., a plurality of individual devices of various kinds. The individual devices may include various microelectronic devices, for example, a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a micro-electro-mechanical system (MEMS), an active device, a passive device, etc. The individual devices may be electrically connected to a conductive region of the semiconductor substrate, where the first semiconductor chip 100 and the second semiconductor chip 200 are mounted. Active surfaces of the first and second semiconductor chips 100 and 200, where the individual devices are on the active surfaces, may face opposite the printed circuit board 500.

In some embodiments, each of the first semiconductor chip 100 and the second semiconductor chip 200 may be, for example, a volatile memory semiconductor chip such as a dynamic random access memory (DRAM).

The resistor unit 400 may be mounted on the printed circuit board 500 and may include a plurality of connection terminals. The connection terminals may include a first connection terminal and a second connection terminal. The first connection terminal of the resistor unit 400 may be connected to the first pad 516 on the printed circuit board 500. The second connection terminal of the resistor unit 400 may be connected to the second pad 526 on the printed circuit board 500. For example, the resistor unit 400 may be a resistor circuit, and the resistor circuit may include at least one resistor. For example, the resistor unit 400 may be implemented as at least one chip resistor, and may be mounted so that opposite ends of the resistor unit 400 contact the first pad 516 and the second pad 526. The first semiconductor chip 100 and the second semiconductor chip 200 are mounted on a center portion of the printed circuit board 500. The resistor unit 400 may be mounted, for example, on a peripheral portion of the printed circuit board 500 which surrounds the center portion.

Figure 2A:
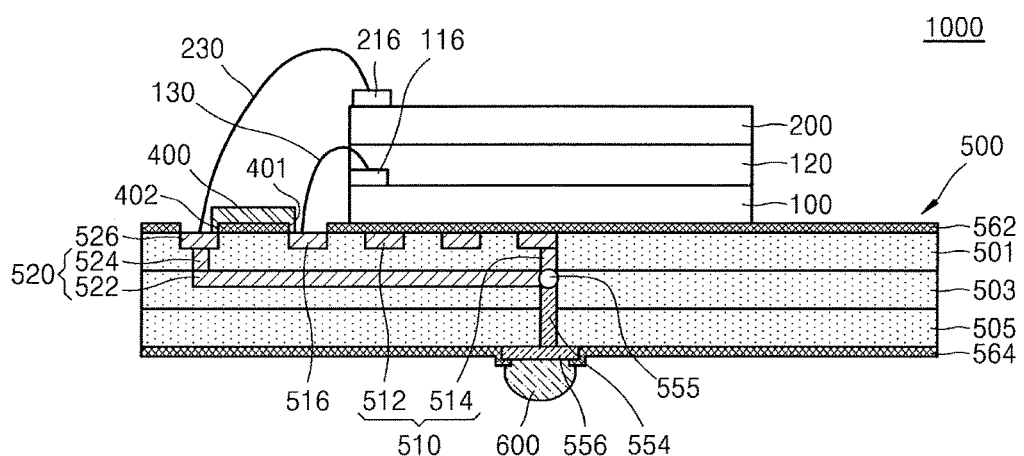
FIG. 2A illustrates a view along section line A-A' in FIG. 1.
Figure 2B:
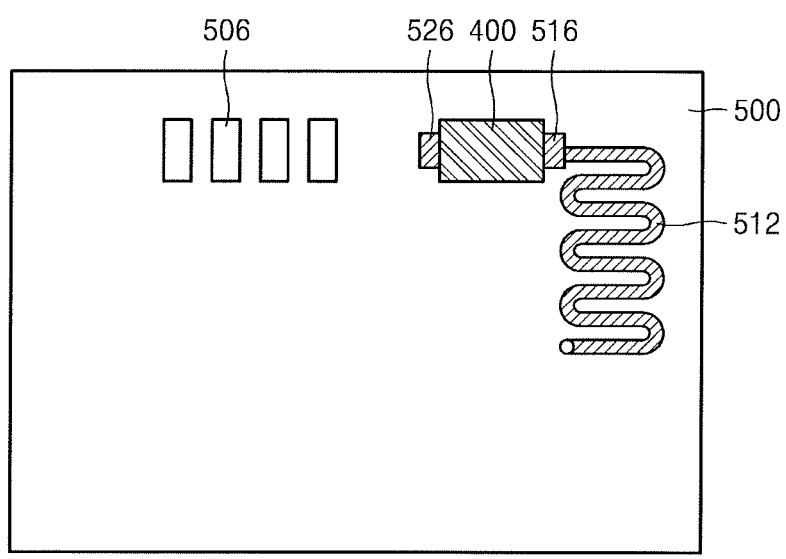
FIG. 2B illustrates an embodiment of a printed circuit board in the semiconductor package.

FIG. 2A illustrates a cross-sectional view of the semiconductor package 1000 taken along a line A-A' of FIG. 1. FIG. 2B is a top view illustrating part of an upper surface of the printed circuit board 500 in the semiconductor package 1000.

Referring to FIG. 2A, the semiconductor package 1000 may include the printed circuit board 500, the resistor unit 400, the first semiconductor chip 100, the second semiconductor chip 200, and the external connection terminals 600 formed on a lower surface of the printed circuit board 500. The first semiconductor chip 100 and the second semiconductor chip 200 may be sequentially stacked on the printed circuit board 500. The first semiconductor chip 100 and the second semiconductor chip 200 may be stacked and aligned with each other in a direction perpendicular to the upper surface of the printed circuit board 500. The resistor unit 400 may be mounted so that opposite ends of the resistor unit 400 contact the first pad 516 and the second pad 526. A first connection terminal 401 of the resistor unit 400 contact the first pad 516, and a second connection terminal 402 of the resistor unit 400 contact the second pad 526.

A bonding layer 120 may be between the first semiconductor chip 100 and the second semiconductor chip 200. The first semiconductor chip 100 and the second semiconductor chip 200 may be bonded to each other via the bonding layer 120. Part of the first bonding wire 130 may be embedded by the bonding layer 120.

A first rewiring layer and a second rewiring layer may be respectively formed on upper surfaces of the first semiconductor chip 100 and the second semiconductor chip 200. The first bonding wire 130 connected to the first semiconductor chip 100 may be electrically connected to the first rewiring layer. The second bonding wire 230 connected to the second semiconductor chip 200 may be electrically connected to the second rewiring layer. Therefore, the pads 116, 106, 216, and 206 on the upper surfaces of the first semiconductor chip 100 and the second semiconductor chip 200 may be arranged in the first rewiring layer and the second rewiring layer.

The printed circuit board 500 may include a plurality of layers, in which a plurality of base layers 501, 503, and 505 are stacked. In some embodiments, each of the base layers 501, 503, and 505 may include at least one of a phenol resin, an epoxy resin, and polyimide. For example, each of the base layers 501, 503, and 505 may include at least one of frame retardant 4 (FR4), tetrafunctional epoxy, polyphenylene ether, epoxy/polyphenylene oxide, bismaleimide triazine (BT), thermount, cyanate ester, polyimide, and liquid crystal polymer. FIG. 2A shows three base layers 501, 503, and 505, but a different number (e.g., two, four or more) base layers may be formed in another embodiment.

The first pad 516 and the second pad 526 are on an upper surface of the uppermost layer from among the base layers 501, 503, and 505. A lower pad 556 may be on a lower surface of the lowermost layer from among the base layers 501, 503, and 505. The lower pad 556 may contact the external connection terminal 600 to receive a signal from the external connection terminal 600. The lower pad 556 is shown to be formed at a center portion of the printed circuit board 500, but may be at different location in another embodiment. According to formation of a first transfer line 510 a second transfer line 520, and a signal transfer line 554, the lower pad 556 may be on the peripheral region surrounding the center region of the printed circuit board 500.

A metal layer may be further formed on each of the first pad 516, the second pad 526, and the lower pad 556. The metal layer may be formed to improve an adhesive force of each of the first pad 516, the second pad 526, and the lower pad 556, and to reduce contact resistance. The metal layer may be formed, for example, by a hot air solder leveling (H.A.S.L.) method, a Ni/Au plating method, or another method.

A branch 555 where the first transfer line 510, the second transfer line 520, and the signal transfer line 554 meet one another may be formed in the printed circuit board 500. The signal transfer line 554 electrically connects the branch 555 to the external connection terminal 600, so that a signal transmitted from outside via the external connection terminal 600 may be transferred to the first semiconductor chip 100 and the second semiconductor chip 200. The signal may be distributed to the first transfer line 510 and the second transfer line 520 based on the branch 555 and transferred to the first semiconductor chip 100 and the second semiconductor chip 200. In FIG. 2A, the signal transfer line 554 has a via structure and may include a conductive line at the same layer level. The signal transfer line 554 may have a different structure in another embodiment.

The first transfer line 510 may electrically connect the branch 555 to the first pad 516. The first transfer line 510 may include a first via structure 514 penetrating through at least one layer of the printed circuit board 500, and a first wiring pattern 512 formed at the same layer level as that of the printed circuit board 500. The second transfer line 520 may electrically connect the branch 555 to the second pad 526. The second transfer line 520 may include a second via structure 524 penetrating through at least one layer of the printed circuit board 500, and a second wiring pattern 522 formed at the same layer level as that of the printed circuit board 500.

The signal received by the lower pad 556 of the printed circuit board 500 is transferred inside the printed circuit board 500 along the signal transfer line 554. The signal is distributed to the first transfer line 510 and the second transfer line 520 based on the branch 555 and transferred to the first semiconductor chip 100 and the second semiconductor chip 200.

The first transfer line 510 and the second transfer line 520 may have substantially the same lengths as each other. For example, the lengths of the first transfer line 510 and the second transfer line 520 may be substantially equal to quarter of a wavelength of the signal transmitted from outside via the external connection terminal 600. The first transfer line 510 and the second transfer line 520 may have substantially the same impedance as each other. Impedance of the resistor unit 400 may be related to the impedance of the first transfer line 510 and the second transfer line 520. This is to implement a structure of Wilkinson divider on the printed circuit board 500.

The first wiring pattern 512 and the second wiring pattern 522 may be on respective upper and lower surfaces of each of the base layers 501, 503, and 505. The first wiring pattern 512 and the second wiring pattern 522 may include, for example, electrolytically deposited (ED) copper foil, rolled-annealed (RA) copper foil, stainless steel foil, aluminum foil, ultra-thin copper foil, sputtered copper, copper alloys, etc.

The first wiring pattern 512 and the second wiring pattern 522 may be at different layer levels from each other. For example, the first wiring pattern 512 may be on an upper surface of the first base layer 501 and the second wiring pattern 522 may be on an upper surface of the second base layer 503. This arrangement may be different in another embodiment. For example, a space may be provided that is sufficient to allow both the first wiring pattern 512 and the second wiring pattern 522 to be formed at the same layer of the printed circuit board 500. In this case (e.g., when the first wiring pattern 512 and the second wiring pattern 522 are at the same layer), the lengths of the first transfer line 512 and the second transfer line 520 may satisfy the quarter of the wavelength of the signal transmitted from outside.

The signal transfer line 554, the first via structure 514, and the second via structure 524 may include, for example, copper, nickel, stainless steel, or beryllium copper.

An upper solder resist layer 562 and a lower solder resist layer 564 may be formed respectively on an upper surface of the uppermost layer and a lower surface of the lowermost layer among the base layers 501, 503, and 505. Each of the upper solder resist layer 562 and the lower solder resist layer 564 may be formed, for example, by spraying a solder mask insulating ink onto the upper surface of the uppermost layer and the lower surface of the lowermost layer, among the base layers 501, 503, and 505, by a screen printing method or an inkjet printing method and curing the sprayed solder mask insulating ink by ultraviolet (UV) or infrared (IR) light.

In some embodiments, each of the upper solder resist layer 562 and the lower solder resist layer 564 may be formed, on the upper surface of the uppermost layer and the lower surface of the lowermost layer among the plurality of base layers 501, 503, and 505, by entirely spraying a photo-imageable solder resist by a screen printing method or a spray coating method, or by attaching a film-type solder resist material by a laminating method, removing unnecessary parts by an exposure and development process, and curing the solder resist by using heat, UV light, or IR light.

Referring to FIGS. 2A and 2B, at least one of the first wiring pattern 512 and the second wiring pattern 522 may have a zig-zag shape. In order to make the length of the first transfer line 510 substantially equal to a quarter of the wavelength of the signal transmitted from outside via the external connection terminal 600, the first wiring pattern 512 may be formed to have zig-zags. In one example embodiment, where there is sufficient length The first wiring pattern 512 may be formed to have a different shape (e.g., straight or a non-zig-zag shape) when there is sufficient length or space.

The second wiring pattern 522 is shown to be straight. In one example embodiment, the second wiring pattern 522 may be formed to have a zig-zag shape, in order to reach a length that is substantially equal to a quarter of the wavelength of the signal transmitted from outside via the external connection terminal 600. The first wiring pattern 512 and the second wiring pattern 522 may be formed to have different or other shapes in other embodiments.

Figure 3:
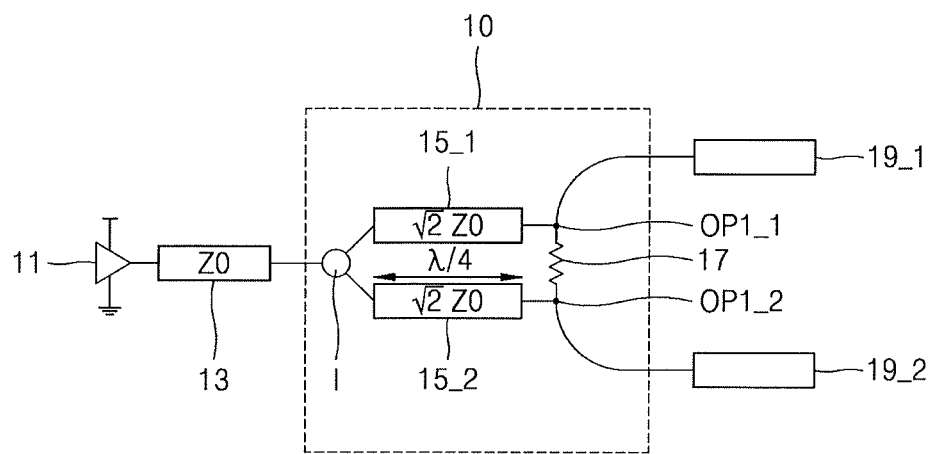
FIG. 3 illustrates an embodiment for transferring signals in a semiconductor package.

FIG. 3 illustrates an embodiment for transferring signals in the semiconductor package 1000. Referring to FIGS. 2A and 3, the signal transfer line 554, the branch 555, the first transfer line 510, the second transfer line 520, and the resistor unit 400 of the semiconductor package 1000 may form a Wilkinson divider 10. The relationship of the signal transfer line 554, branch 555, first transfer line 510, second transfer line 520, and resistor unit 400 of the semiconductor package 1000 is described below.

The Wilkinson divider 10 may include a branch I, an input line 13, a plurality of transfer lines 15_1 and 15_2, and a resistor 17. The Wilkinson divider 10 may receive a signal from a driver 11 and divide the signal to a plurality of output lines using lines of T-junction structure. When the input line 13 has an impedance of Z0, each of the transfer lines branched from the branch I may have an impedance of $\sqrt{2}Z0$. The length of each of the transfer lines 15_1 and 15_2 may be substantially equal to a quarter of a wavelength ($\lambda$) of the signal transmitted from the driver 11.

The branch I may correspond to the branch 555 of FIG. 2A. The transfer lines 15_1 and 15_2 may correspond to the first transfer line 510 and the second transfer line 520 of FIG. 2A. The input line 13 may correspond to the signal transfer line 554. Therefore, the signal transfer line 554 may have an impedance of Z0. Also, the first and second wiring patterns 511 and 522 and the first and second via structures 514 and 524 may be formed so that each of the first and second transfer lines 510 and 520 has an impedance of $\sqrt{2}Z0$ and a length equal to a quarter of the wavelength ($\lambda$) of the transmitted signal.

A plurality of output terminals OP1_1 and OP1_2 may be connected to the resistor 17. The magnitude of the resistor 17 may be 2Z0. A plurality of semiconductor chips 19_1 and 19_2 may be connected to each of the output terminals OP1_1 and OP1_2. The output terminals OP1_1 and OP1_2 may respectively correspond to the first pad 516 and the second pad 526 of FIG. 2A. The resistor 17 and the semiconductor chips 19_1 and 19_2 may respectively correspond to the resistor unit 400, the first semiconductor chip 100, and the second semiconductor chip 200 of FIG. 2A.

One type of structure includes an on-die termination (ODT) at a plurality of output terminals to prevent unnecessary interference between signals output from the plurality of output terminals. In such a structure, electric current may flow to the ODT and cause unnecessary power consumption. On the other hand, the Wilkinson divider 10 does not form a line in addition to the transfer lines 15_1 and 15_2 connected to the plurality of semiconductor chips 19_1 and 19_2. Thus, power consumption may be reduced. In addition, impedance matching is performed using the plurality of transfer lines 15_1 and 15_2 and the resistor 17. Also, isolation characteristics between the output terminals OP1_1 and OP1_2 may be improved. This may offset distortion of a signal reflected by a semiconductor chip that is not selected between the semiconductor chips 19_1 and 19_2.

The Wilkinson divider 10 includes two output terminals OP1_1 and OP1_2 and two semiconductor chips that are connected. In one embodiment, a different number of semiconductor chips may be connected.

Figure 4:
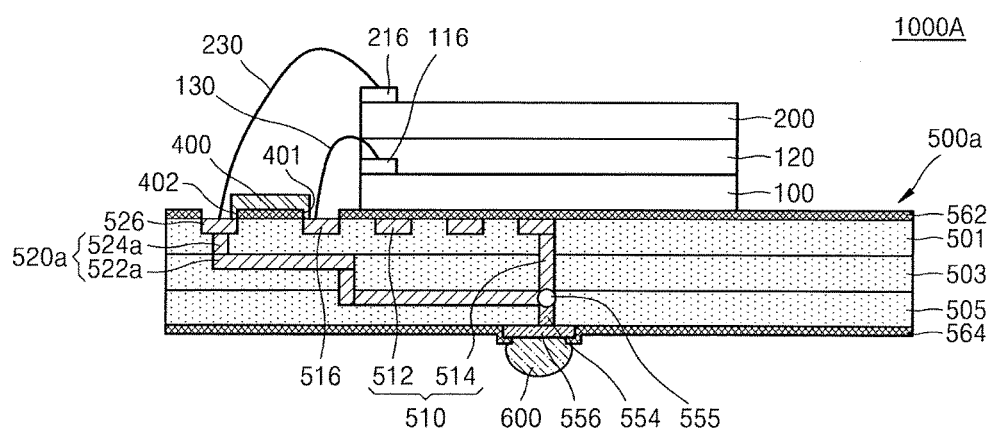
FIG. 4 illustrates another embodiment of a semiconductor package.

FIG. 4 illustrates another embodiment of a semiconductor package 1000A which may include a printed circuit board 500a, the resistor unit 400, the external connection terminal 600, the first semiconductor chip 100, and the second semiconductor chip 200.

The first transfer line 510, a second transfer line 520a, and the signal transfer line 554 meet one another at the branch 555 in the printed circuit board 500a. The signal transferred by the signal transfer line 554 is distributed to the first transfer line 510 and the second transfer line 520a based on the branch 555 and transferred to the first semiconductor chip 100 and the second semiconductor chip 200.

The first transfer line 510 may include the first via structure 514 penetrating through at least one layer of the printed circuit board 500a, and the first wiring pattern 512 formed at the same layer level as that of the printed circuit board 500a. The second transfer line 520a may include a second via structure 524a penetrating through at least one layer of the printed circuit board 500a, and a second wiring pattern 522a formed at the same layer level as that of the printed circuit board 500a.

The second wiring pattern 522a may include a plurality of wiring patterns at different layer levels from one another. For example, the second wiring pattern 522a may be formed throughout an upper surface of the second base layer 503 and an upper surface of the third base layer 505. Accordingly, the second via structure 524a may be formed as a via structure penetrating through the first base layer 501 and a via structure penetrating through the second base layer 503. In one embodiment, the first wiring pattern 512 may also include a plurality of wiring patterns at different layer levels from one another. The first via structure 514, the first wiring pattern 512, the second via structure 514, and the second wiring pattern 522a may be formed so that the lengths of the first transfer line 510 and the second transfer line 520 may satisfy a quarter of the wavelength of the signal transmitted from outside.

Figure 5:
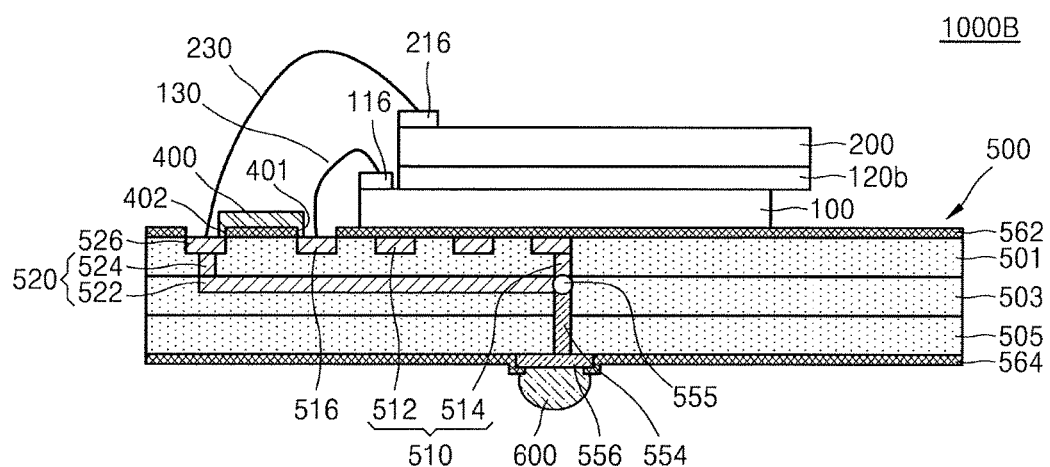
FIG. 5 illustrates another embodiment of a semiconductor package.

FIG. 5 illustrates another embodiment of a semiconductor package 1000B which may include the printed circuit board 500, the resistor unit 400, the external connection terminal 600, the first semiconductor chip 100, and the second semiconductor chip 200.

The first semiconductor chip 100 and the second semiconductor chip 200 may be sequentially stacked on the printed circuit board 500. In one embodiment, the first semiconductor chip 100 and the second semiconductor chip 200 may be stacked as stairs. Accordingly, the first bonding wire 130 may not be embedded by a bonding layer 120b. The stair shape may be formed so that the pad 116 on the first semiconductor chip 100 may be exposed to outside.

Figure 6:
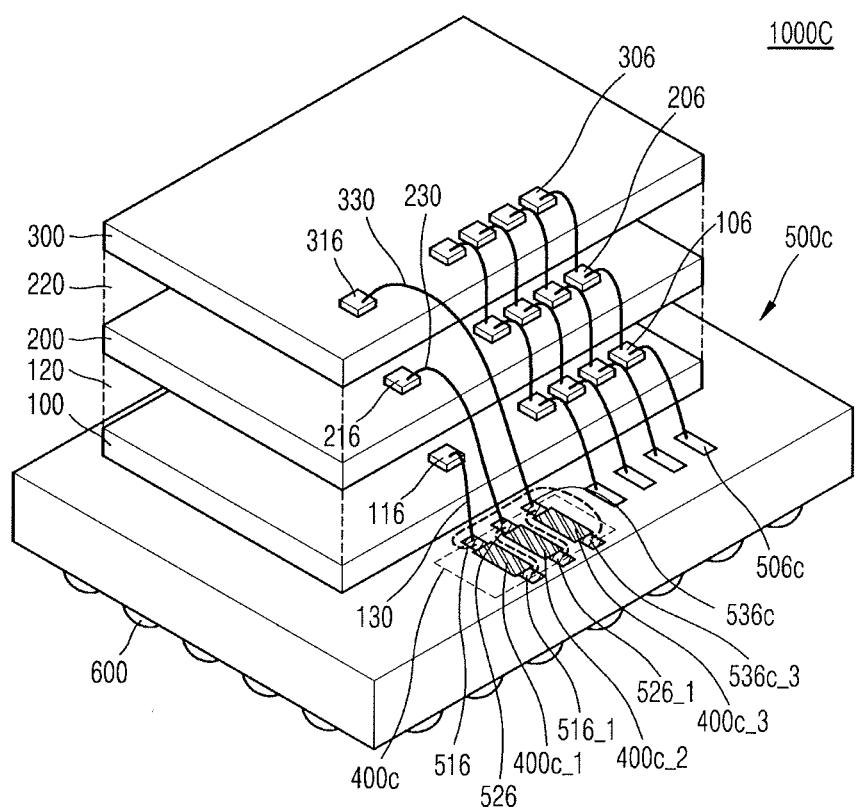
FIG. 6 illustrates another embodiment of a semiconductor package.

FIG. 6 illustrates another embodiment of a semiconductor package 1000C which may include a printed circuit board 500c, a resistor unit 400c, the external connection terminal 600, the first semiconductor chip 100, the second semiconductor chip 200, and a third semiconductor chip 300.

The first pad 516, the second pad 526, a third pad 536c, a fourth pad 516_1, a fifth pad 526_1, and a sixth pad 536c_1 may be on an upper surface of the printed circuit board 500c. A first transfer line, a second transfer line, and a third transfer line may meet one another at a branch formed in the printed circuit board 500c. The signals transferred through the external connection terminal 600 and the signal transfer line are distributed to the first transfer line, the second transfer line, and the third transfer line based on the branch, and transferred to the first semiconductor chip 100, the second semiconductor chip 200, and the third semiconductor chip 300. For example, the first transfer line, the second transfer line, and the third transfer line on the printed circuit board 500c may be similar to forming a third transfer line in addition to the structure of the first transfer line 510 and the second transfer line 520 of FIG. 2A, the first transfer line 510 and the second transfer line 520a of FIG. 4, and the first transfer line 510 and the second transfer line 520 of FIG. 5.

The signal transfer line electrically connects the branch to the external connection terminal 600 and may transfer the signal transmitted from outside via the external connection terminal 600 to the first semiconductor chip 100, the second semiconductor chip 200, and the third semiconductor chip 300. The first transfer line may electrically connect the branch to the first pad 516. The second transfer line may electrically connect the branch to the second pad 526. The third transfer line may electrically connect the branch to the third pad 536c.

The first transfer line, the second transfer line, and the third transfer line may have lengths that are substantially equal to a quarter of the wavelength of the signal transmitted from outside and may have substantially the same impedance as one another. The impedance of the resistor unit 400c may be related to the impedance of the first transfer line, the second transfer line, and the third transfer line. This is to implement a structure of Wilkinson divider on the printed circuit board 500c.

The printed circuit board 500c may include a plurality of layers. Each of the first transfer line, the second transfer line, and the third transfer line may include a via structure penetrating through at least one layer of the printed circuit board 500*c*, and a wiring pattern formed at the same layer level of the printed circuit board 500*c*.

The first semiconductor chip 100, the second semiconductor chip 200, and the third semiconductor chip 300 may be sequentially stacked on the printed circuit board 500*c*. A second bonding layer 220 is between the second semiconductor chip 200 and third semiconductor chip 300 in order to bond the second semiconductor chip 200 and the third semiconductor chip 300 and insulate the second semiconductor chip 200 and third semiconductor chip 300 from each other. The third semiconductor chip 300 may include a plurality of pads 316 and 306 on an upper surface thereof. In one embodiment, the pads 316 and 306 may be on a lower surface of the third semiconductor chip 300.

The first semiconductor chip 100, the second semiconductor chip 200, and the third semiconductor chip 300 may be mounted on the printed circuit board 500*c*, for example, by a wire bonding method. A first bonding wire 130 may electrically connect the first pad 516 to the first semiconductor chip 100. A second bonding wire 230 may electrically connect the second pad 526 to the second semiconductor chip 200. A third bonding wire 330 may electrically connect the third pad 536*c* to the third semiconductor chip 300. In one embodiment, the first semiconductor chip 100, the second semiconductor chip 200, and the third semiconductor chip 300 may be mounted on the printed circuit board 500*c*, for example, by a flip-chip bonding method.

The resistor unit 400*c* may be mounted on the printed circuit board 500*c*. The resistor unit 400*c* may include first to third chip resistors 400*c*_1, 400*c*_2, and 400*c*_3, and a plurality of connection terminals may be formed in the resistor unit 400*c*. A first connection terminal of the first chip resistor 400*c*_1 may be connected to the first pad 516 on the printed circuit board 500*c*, and a second connection terminal of the first chip resistor 400*c*_1 may be connected to the fourth pad 516_1 on the printed circuit board 500*c*. A first connection terminal of the second chip resistor 400*c*_2 may be connected to the second pad 526 on the printed circuit board 500*c*, and a second connection terminal of the second chip resistor 400*c*_2 may be connected to the fifth pad 526_1 on the printed circuit board 500*c*. A first connection terminal of the third chip resistor 400*c*_3 may be connected to the third pad 536*c* on the printed circuit board 500*c*, and a second connection terminal of the third chip resistor 400*c*_3 may be connected to the sixth pad 536*c*_1 on the printed circuit board 500*c*.

The second connection terminal of the first chip resistor 400*c*_1 may be electrically connected to the second pad 526 through a conduction line which includes a via structure penetrating through at least one layer of the printed circuit board 500*c* and a wiring pattern formed at the same layer level of the printed circuit board 500*c*. The second connection terminal of the second chip resistor 400*c*_2 may be electrically connected to the third pad 536*c* through a conduction line which includes a via structure penetrating through at least one layer of the printed circuit board 500*c* and a wiring pattern formed at the same layer level of the printed circuit board 500*c*. The second connection terminal of the third chip resistor 400*c*_3 may be electrically connected to the first pad 516 through a conduction line which includes a via structure penetrating through at least one layer of the printed circuit board 500*c* and a wiring pattern formed at the same layer level of the printed circuit board 500*c*.

The first to third chip resistors 400*c*_1, 400*c*_2, and 400*c*_3 may have substantially the same impedance values.

In one embodiment, the resistance values may vary in a case where the same effect may be obtained from another equivalent circuit of different structure and a plurality of resistors included in the resistor unit 400*c* may have different connecting structures.

Figure 7:
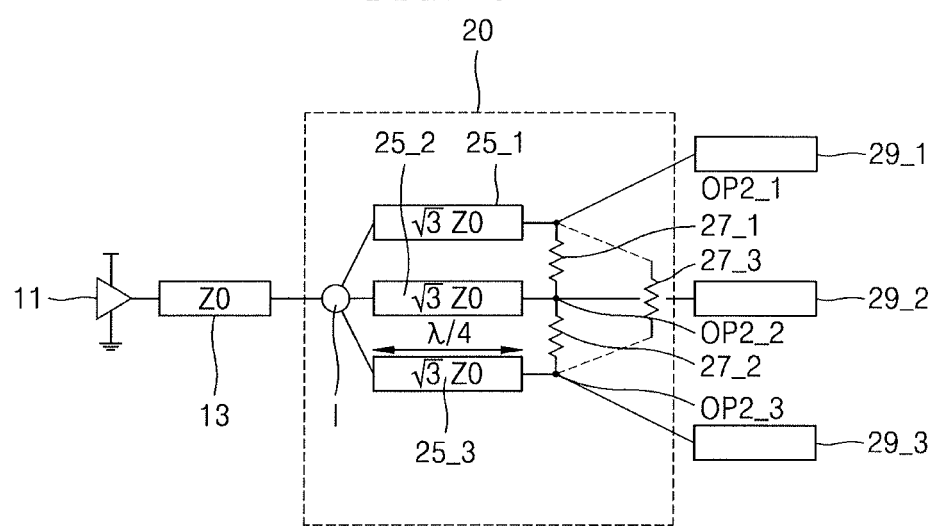
FIG. 7 illustrates another embodiment for transferring signals in a semiconductor package.

FIG. 7 illustrates an embodiment for transferring signals in a semiconductor package 1000C. Referring to FIGS. 6 and 7, the signal transfer lines, the branch, the first transfer line, the second transfer line, the third transfer line, and the resistor unit 400*c* of semiconductor package 1000C may form a Wilkinson divider 20.

The Wilkinson divider 20 may include a branch I, an input line 13, a plurality of transfer lines 25_1, 25_2, and 25_3, and a plurality of resistors 27_1, 27_2, and 27_3. When the input line 13 has an impedance of Z0, each of the transfer lines 25_1, 25_2, and 25_3 divided at the branch I may have substantially the same impedance, that is, $\sqrt{3}Z0$. The length of each of the transfer lines 25_1, 25_2, and 25_3 may be substantially equal to a quarter of the wavelength ($\lambda$) of the signal transmitted from the driver 11.

The branch I may correspond to the branch in the printed circuit board 500*c*. The transfer lines 25_1, 25_2, and 25_3 may correspond to the first to third transfer lines in the printed circuit board 500*c*. The input lint 13 may correspond to the signal transfer line in the printed circuit board 500*c*.

Output terminals OP2_1, OP2_2, and OP2_3 may be connected to the resistors 27_1, 27_2, and 27_3. For example, the first resistor 27_1 may have opposite ends connected to the first output terminal OP2_1 and the second output terminal OP2_2. The second resistor 27_2 may have opposite ends connected to the second output terminal OP2_2 and the third output terminal OP2_3. The third resistor 27_3 may have opposite ends connected to the third output terminal OP2_3 and the first output terminal OP2_1. Each of the resistors 27_1, 27_2, and 27_3 may have a resistance value of 3Z0.

In one embodiment, the resistors 27_1, 27_2, and 27_3 may configure another equivalent circuit to exhibit the same effects. When an equivalent circuit having a different structure from that of FIG. 7 is configured, connecting structures between the resistors 27_1, 27_2, and 27_3 and the output terminals OP2_1, OP2_2, and OP2_3 may vary, and impedance values of the resistors 27_1, 27_2, and 27_3 may vary.

A plurality of semiconductor chips 29_1, 29_2, and 29_3 may be connected respectively to the output terminals OP2_1, OP2_2, and OP2_3. The output terminals OP2_1, OP2_2, and OP2_3 may correspond to the first to third pads 516, 526, and 536*c* of FIG. 6. The resistors 27_1, 27_2, and 27_3 and the semiconductor chips 29_1, 29_2, and 29_3 may respectively correspond to the resistor unit 400*c* and the first to third semiconductor chips 100, 200, and 300 of FIG. 6.

The Wilkinson divider 20 does not necessarily form additional lines besides the transfer lines 25_1, 25_2, and 25_3 connected to the semiconductor chips 29_1, 29_2, and 29_3. Thus, unnecessary power consumption may be reduced. In addition, impedance matching may be performed using the transfer lines 25_1, 25_2, and 25_3 and the resistors 27_1, 27_2, and 27_3, and distortion of the signal reflected by a semiconductor chip that is not selected from among the semiconductor chips 29_1, 29_2, and 29_3 may be offset.

Figure 8:
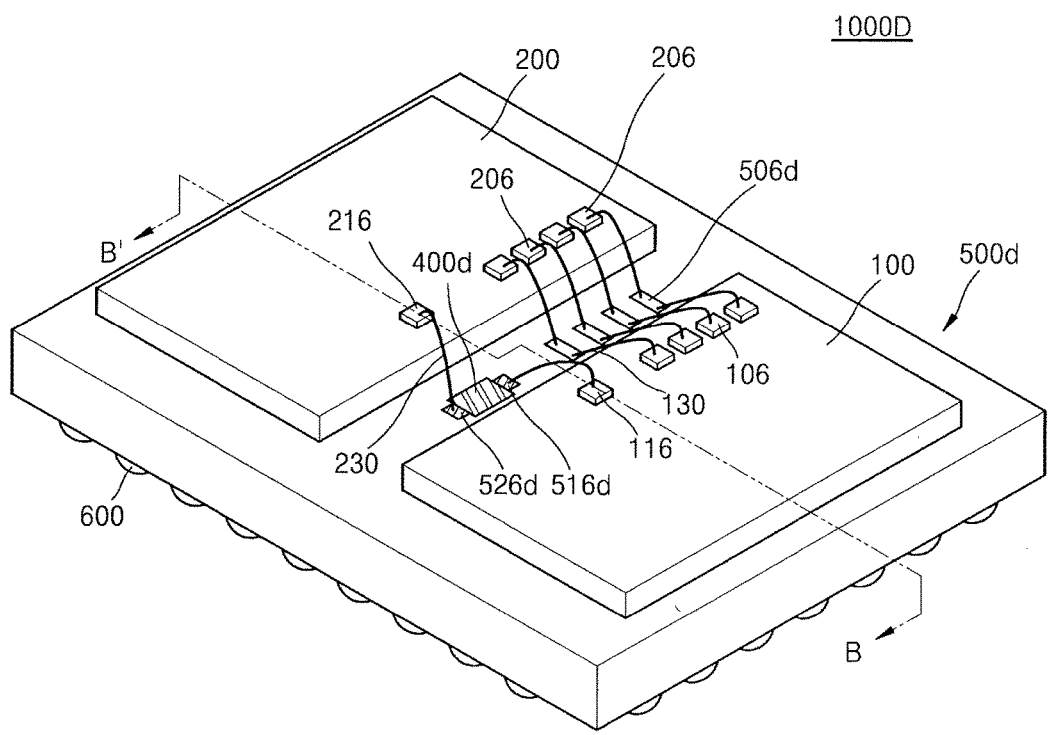
FIG. 8 illustrates another embodiment of a semiconductor package.
Figure 9:
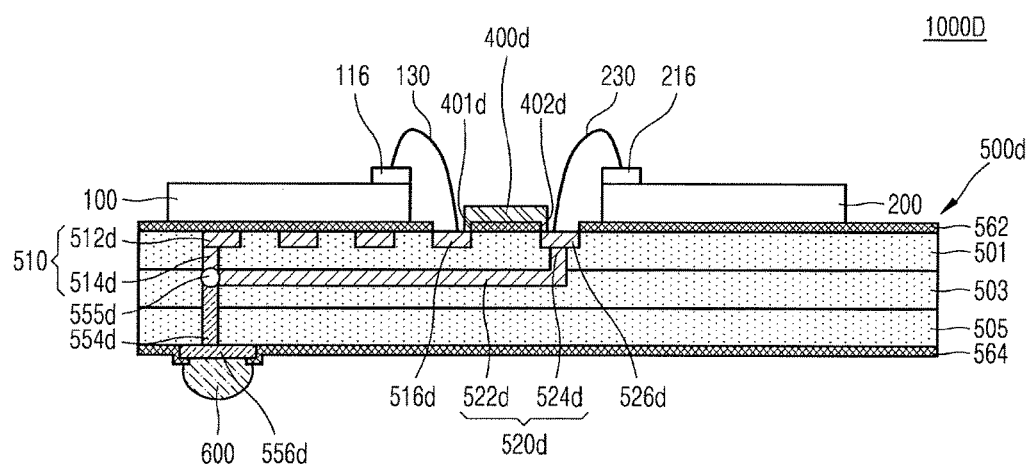
FIG. 9 illustrates a view of the semiconductor package in FIG. 8 along section line B-B'.

FIG. 8 illustrates another embodiment of a semiconductor package 1000D, and FIG. 9 illustrates view taken along section line B-B' in FIG. 8. Referring to FIG. 8, the semiconductor package 1000D may include a printed circuit board 500*d*, a resistor unit 400*d*, the external connection terminal 600, the first semiconductor chip 100, and the second semiconductor chip 200. A plurality of pads 516d, 526d, and 506d including a first pad 516d and a second pad 526d may be formed on an upper surface of the printed circuit board 500d.

The first semiconductor chip 100 and the second semiconductor chip 200 may be mounted on the same plane of the printed circuit board 500d. The first semiconductor chip 100 and the second semiconductor chip 200 may be mounted on the printed circuit board 500d, for example, by a wire bonding method. Therefore, the semiconductor package 1000D may include a first bonding wire 130 electrically connecting the first pad 516d of the printed circuit board 500d to the first semiconductor chip 100, and a second bonding wire 230 connecting the second pad 526d of the printed circuit board 500d to the second semiconductor chip 200. In one embodiment, the first semiconductor chip 100 and the second semiconductor chip 200 may be mounted on the printed circuit board 500d, for example, by a flip-chip bonding method.

Referring to FIG. 8 and FIG. 9, the resistor unit 400d may be mounted on the printed circuit board 500d. The resistor unit 400d may include a plurality of connection terminals including a first connection terminal 401d and a second connection terminal 402d. The first connection terminal 401d of the resistor unit 400d is connected to the first pad 516d on the printed circuit board 500d. The second connection terminal 402d of the resistor unit 400d may be connected to the second pad 526d on the printed circuit board 500d. For example, the resistor unit 400d may be implemented as at least one chip resistor and may be mounted so that opposite ends of the resistor unit 400d may contact the first pad 516d and the second pad 526d. The resistor unit 400d may be on a region between the first semiconductor chip 100 and the second semiconductor chip 200 on the printed circuit board 500d.

Referring to FIG. 9, the printed circuit board 500d may include a plurality of base layers 501, 503, and 505 stacked with one another. The first pad 516d and the second pad 526d are on an upper surface of the uppermost layer from among the base layers 501, 503, and 505./ A lower pad 556d may be on a lower surface of the lowermost layer from among the base layers 501, 503, and 505.

The lower pad 556d may be formed, for example, on a peripheral region surrounding a center region of the printed circuit board 500d. According to formation of a first transfer line 510d, a second transfer line 520d, and a signal transfer line 554d, the lower pad 556d may be formed on the center region of the printed circuit board 500d.

The first transfer line 510d, the second transfer line 520d, and the signal transfer line 554d meet one another at a branch 555d formed in the printed circuit board 500d. The signal transfer line 554d electrically connects the branch 555d to the external connection terminal 600, so that a signal transmitted from outside via the external connection terminal 600 may be transferred to the first semiconductor chip 100 and the second semiconductor chip 200. The first transfer line 510d and the second transfer line 520d may be electrically isolated from each other at the branch 555d.

The first transfer line 510d may electrically connect the branch 555d to the first pad 516d. The first transfer line 510d may include a first via structure 514d penetrating through at least one layer of the printed circuit board 500d, and a first wiring pattern 512d formed at the same layer level as that of the printed circuit board 500d. The second transfer line 520d may electrically connect the branch 555d to the second pad 526d. The second transfer line 520d may include a second via structure 524d penetrating through at least one layer of the printed circuit board 500d, and a second wiring pattern 522d at the same layer level as that of the printed circuit board 500d.

The first transfer line 510d and the second transfer line 520d may have substantially the same lengths as each other. The lengths of the first transfer line 510d and the second transfer line 520d may be substantially equal to a quarter of the wavelength of the signal transmitted from outside via the external connection terminal 600. The first transfer line 510d and the second transfer line 520d may have substantially the same impedance as each other.

The first wiring pattern 512d and the second wiring pattern 522d may be at different layer levels from each other. In a case where there is a space sufficient to form both the first wiring pattern 512d and the second wiring pattern 522d at the same layer of the printed circuit board 500d, the lengths of the first transfer line 510d and the second transfer line 520d may satisfy a quarter of the wavelength of the signal transmitted from outside and the first wiring pattern 512d and the second wiring pattern 522d may be formed at the same layer.

The first wiring pattern 512d and the second wiring pattern 522d may include a plurality of wiring patterns at different layers from each other. For example, the second wiring pattern 522d may be formed throughout an upper surface of the second base layer 503 and an upper surface of the third base layer 505. Accordingly, the second via structure 524d may be formed as a via structure penetrating through the first base layer 501 and a via structure penetrating through the second base layer 503.

At least one of the first wiring pattern 512d and the second wiring pattern 522d may have zig-zags similar to the first wiring pattern 512 in FIG. 2B. For example, the first wiring pattern 512d may have zig-zags so that the first transfer line 510d has a length substantially equal to a quarter the wavelength of the received signal. In a case where there is sufficient length, the first wiring pattern 512d may be formed straight or may have a non-zig-zag shape.

The lower pad 556d may be, for example, on the peripheral region surrounding the center region of the printed circuit board 500d. According to formation of the first transfer line 510d, the second transfer line 520d, and the signal transfer line 554d, the lower pad 556d may be on the center region of the printed circuit board 500d.

Figure 10:
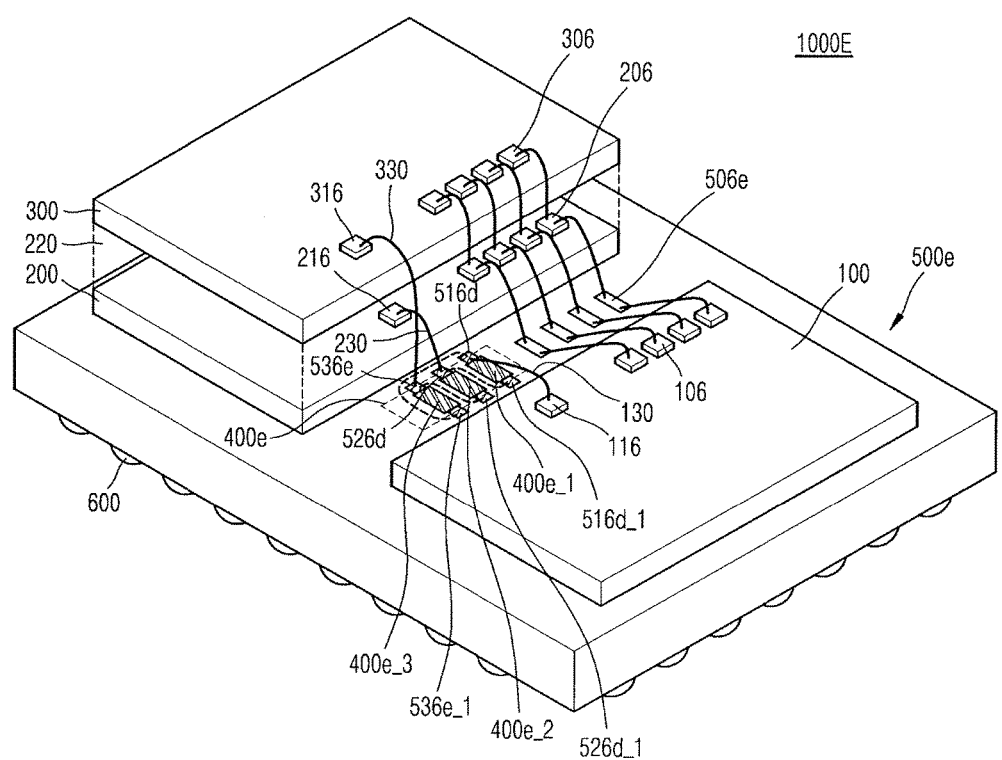
FIG. 10 illustrates another embodiment of a semiconductor package.

FIG. 10 illustrates another embodiment of a semiconductor package 1000E which may include a printed circuit board 500e, a resistor unit 400e, the external connection terminal 600, the first semiconductor chip 100, the second semiconductor chip 200, and the third semiconductor chip 300.

The first pad 516d, the second pad 526d, a third pad 536e, a fourth pad 516d_1, a fifth pad 526d_1 and a sixth pad 536e_1 may be on an upper surface of the printed circuit board 500e. A first transfer line, a second transfer line, and a third transfer line may meet one another at a branch formed in the printed circuit board 500e. The first transfer line, the second transfer line, and the third transfer line may be electrically isolated from one another at the branch. For example, the first transfer line, the second transfer line, and the third transfer line on the printed circuit board 500e may be similar to forming the third transfer line in addition to the structure including the first transfer line 510d and the second transfer line 520d of FIG. 9.

The signal transfer line electrically connects the branch to the external connection terminal 600 and may transfer the signal transmitted from outside via the external connection terminal 600 to the first semiconductor chip 100, the second semiconductor chip 200, and the third semiconductor chip 300.

The first transfer line may electrically connect the branch to the first pad 516*d*. The second transfer line may electrically connect the branch to the second pad 526*d*. The third transfer line may electrically connect the branch to the third pad 536*e*. The first transfer line, the second transfer line, and the third transfer line may have lengths substantially equal to a quarter of the wavelength of the signal transmitted from outside and may have substantially the same impedance as one another. As described above with reference to FIG. 7, when an input line connected to the branch in the printed circuit board 500*e* has a resistance value of Z0, each of the first, second, and third transfer lines may have a resistance value of $\sqrt{3}Z0$.

The printed circuit board 500*e* may include a plurality of layers. The third transfer line may include a via structure penetrating at least one layer of the printed circuit board 500*e* and a wiring pattern at the same layer as the via structure in the printed circuit board 500*e*.

The third semiconductor chip 300 may be stacked on the second semiconductor chip 200. The second semiconductor chip 200 and the third semiconductor chip 300 may be stacked as stairs or may be stacked to be aligned with each other in a direction perpendicular to an upper surface of the printed circuit board 500*e*. In one embodiment, the third semiconductor chip 300 may be mounted on the same plane as those of the first semiconductor chip 100 and the second semiconductor chip 200.

The third semiconductor chip 300 may be mounted on the printed circuit board 500*e*, for example, by a wire bonding method. A first bonding wire 130 may electrically connect the first pad 516*d* to the first semiconductor chip 100. A second bonding wire 230 may electrically connect the second pad 526*d* to the second semiconductor chip 200. The third bonding wire 330 may electrically connect the third pad 536*e* to the third semiconductor chip 300. In one embodiment, the first semiconductor chip 100, the second semiconductor chip 200, and the third semiconductor chip 300 may be mounted on the printed circuit board 500*e*, for example, by a flip-chip bonding method.

The resistor unit 400*e* may be mounted on the printed circuit board 500*e*. The resistor unit 400*e* may include first to third chip resistors 400*e*_1, 400*e*_2, and 400*e*_3, and may include a plurality of connection terminals. A first connection terminal of the first chip resistor 400*e*_1 may be connected to the first pad 516*d* on the printed circuit board 500*e*, and a second connection terminal of the first chip resistor 400*e*_1 may be connected to the fourth pad 516*d*_1 on the printed circuit board 500*e*. A first connection terminal of the second chip resistor 400*e*_2 may be connected to the second pad 526*d* on the printed circuit board 500*e*, and a second connection terminal of the second chip resistor 400*e*_2 may be connected to the fifth pad 526*d*_1 on the printed circuit board 500*e*. A first connection terminal of the third chip resistor 400*e*_3 may be connected to the third pad 536*e* on the printed circuit board 500*e*, and a second connection terminal of the third chip resistor 400*e*_3 may be connected to the sixth pad 536*e*_1 on the printed circuit board 500*e*.

The second connection terminal of the first chip resistor 400*e*_1 may be electrically connected to the second pad 526*d* through a conduction line which includes a via structure penetrating through at least one layer of the printed circuit board 500*e* and a wiring pattern formed at the same layer level of the printed circuit board 500*e*. The second connection terminal of the second chip resistor 400*e*_2 may be electrically connected to the third pad 536*e* through a conduction line which includes a via structure penetrating through at least one layer of the printed circuit board 500*e* and a wiring pattern formed at the same layer level of the printed circuit board 500*e*. The second connection terminal of the third chip resistor 400*e*_3 may be electrically connected to the first pad 516*d* through a conduction line which includes a via structure penetrating through at least one layer of the printed circuit board 500*e* and a wiring pattern formed at the same layer level of the printed circuit board 500*e*.

The first to third chip resistors 400*e*_1, 400*e*_2, and 400*e*_3 may have substantially the same impedance values. As described above with reference to FIG. 7. each of the first to third chip resistors 400*e*_1, 400*e*_2, and 400*e*_3 may have a resistance value of 3Z0. In one or more embodiments, the resistance values may vary in a case where the same effect may be obtained from another equivalent circuit of different structure and a plurality of resistors included in the resistor unit 400*e* may have different connecting structures.

Figure 11A:
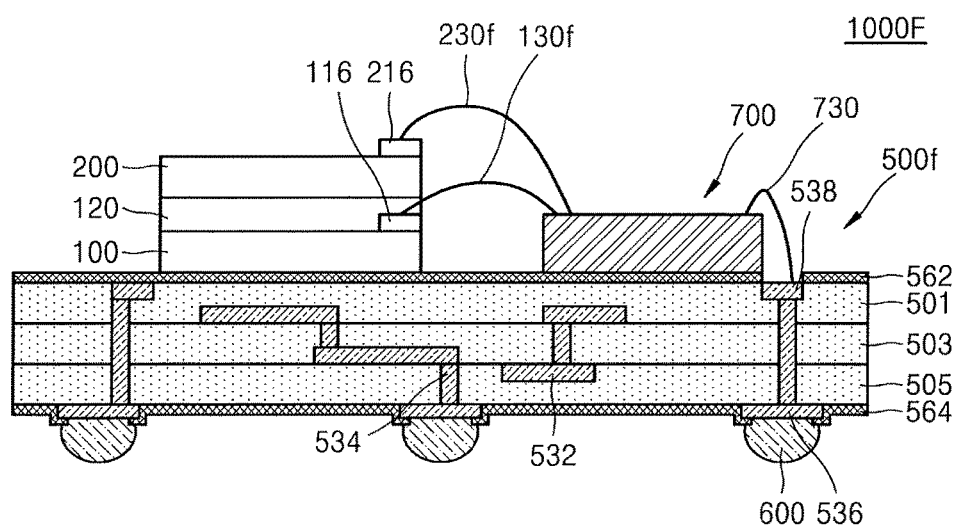
FIG. 11A illustrates another embodiment of a semiconductor package.
Figure 11B:
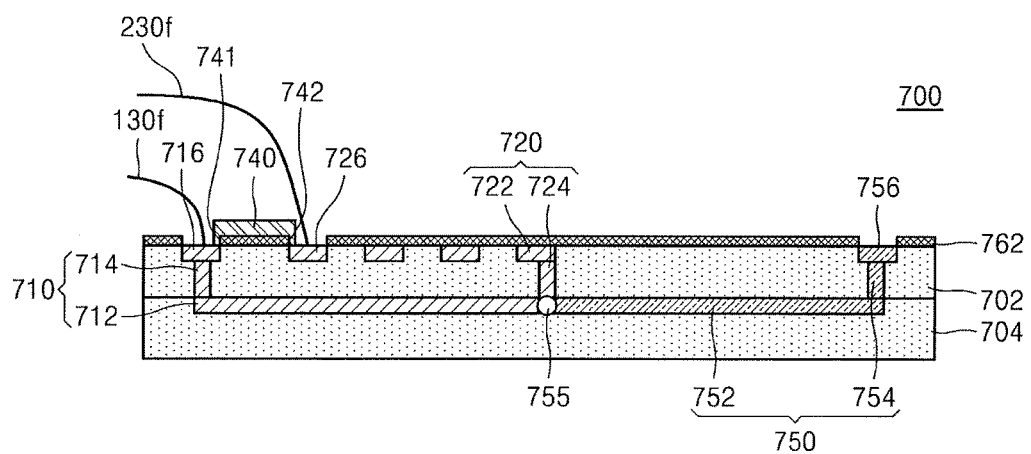
FIG. 11B illustrates an embodiment of a power distribution device.

FIG. 11A illustrates another embodiment of a semiconductor package 1000F, and FIG. 11B illustrates an embodiment of a power distribution device 700 in a semiconductor package.

Referring to FIG. 11A, the semiconductor package 1000F may include a printed circuit board 500*f*, the first semiconductor chip 100, the second semiconductor chip 200, and the power distribution device 700. The first semiconductor chip 100 and the second semiconductor chip 200 may be sequentially stacked on the printed circuit board 500*f*. The first semiconductor chip 100 and the second semiconductor chip 200 may be stacked as stairs or may be stacked to be aligned with each other in a direction perpendicular to an upper surface of the printed circuit board 500*f*.

In one embodiment, the first semiconductor chip 100 and the second semiconductor chip 200 may be mounted on the same plane of the printed circuit board 500*f*. The first semiconductor chip 100 and the second semiconductor chip 200 may be mounted on the printed circuit board 500*f*, for example, by a wire bonding method. In addition to the first semiconductor chip 100 and the second semiconductor chip 200, one or more semiconductor chips may be mounted on the printed circuit board 500*f*. The mounted semiconductor chips may be respectively connected to power distribution device 700.

A first rewiring layer and a second rewiring layer may be respectively formed on upper surfaces of the first semiconductor chip 100 and the second semiconductor chip 200. A first bonding wire 130*f* connecting the first semiconductor chip 100 to the power distribution device 700 may be electrically connected to the first rewiring layer. In addition, a second bonding wire 230*f* connecting the second semiconductor chip 200 to the power distribution device 700 may be electrically connected to the second rewiring layer.

A plurality of wiring patterns 532 may be on an upper surface and a lower surface of each of the base layers 501, 503, and 505. The wiring patterns 532 may include, for example, ED copper foil, RA copper foil, stainless steel foil, aluminum foil, ultra-thin copper foil, sputtered copper, copper alloys, etc. The printed circuit board 500*f* may include a plurality of via structures penetrating through at least one of the plurality of base layers 501, 503, and 505. For example, the via structures 534 may include copper, nickel, stainless steel, or beryllium copper.

The power distribution device 700 may be mounted on the printed circuit board 500*f*, for example, by a wire bonding method. The power distribution device 700 may receive a signal from the printed circuit board 500f via a bonding wire 730 connected to upper pad 538. The power distribution device 700 may transfer the signal respectively to the first semiconductor chip 100 and the second semiconductor chip 200. In order to transfer the signal to the first semiconductor chip 100, the power distribution device 700 may block a distortion signal reflected by the second semiconductor chip 200.

For example, the power distribution device 700 may prevent signal interference between the first semiconductor chip 100 and the second semiconductor chip 200. The power distribution device 700 may have a Wilkinson divider structure. Therefore, interference between the semiconductor chips 100 and 200 on the semiconductor package 1000F may be prevented, and reliability of the signals transferred to the semiconductor chips 100 and 200 may be ensured. Also, since the ODT is not used, unnecessary power consumption may be reduced. For example, the power distribution device 700 may be implemented as a semiconductor package.

Referring to FIGS. 11A and 11B, the power distribution device 700 may include a plurality of insulating layers 702 and 704, an input terminal 756, a first output terminal 716, a second output terminal 726, a resistor unit 740, a signal transfer line 750, a first transfer line 710, and a second transfer line 720. Each of the insulating layers 702 and 704 may include the same material as the base layers 501, 503, and 505. Two insulating layers 702 and 704 are formed in the present embodiment, but one insulating layer or three or more insulating layers may be formed in other embodiments.

A solder resist layer 762 may be at the uppermost layer between the insulating layers 702 and 704. The solder resist layer 762 may be formed in a similar way to forming of an upper solder resist layer 562 and a lower solder resist layer 564.

The input terminal 756, the first output terminal 716, and the second output terminal 726 may be on an upper surface of the uppermost layer between the insulating layers 702 and 704. In one embodiment, the input terminal 756, the first output terminal 716, and the second output terminal 726 may be on a lower surface of the lowermost layer between the insulating layers 702 and 704.

The input terminal 756 may receive a signal from the printed circuit board 500f. The first output terminal 716 may transmit the signal to the first semiconductor chip 100 via a first bonding wire 130f. The second output terminal 726 may transmit the signal to the second semiconductor chip 200 via a second bonding wire 230f. The input terminal 756, the first output terminal 716, and the second output terminal 726 may be implemented as pads exposed from the solder resist layer 762.

When one or more semiconductor chips are additionally mounted on the printed circuit board 500f, the power distribution device 700 may include one or more output terminals. The one or more output terminals and the one or more semiconductor chips may be connected in one-to-one correspondence.

A metal layer may be further formed on each of the input terminal 756, the first output terminal 716, and the second output terminal 726. For example, the metal layer may be formed by a hot air solder leveling (H.A.S.L.), a Ni/Au plating method, etc.

In the power distribution device 700, the first transfer line 710, the second transfer line 720, and the signal transfer line 750 meet one another at a branch 755. Therefore, the first transfer line 710 and the second transfer line 720 may be electrically isolated from each other at the branch 755.

The signal transfer line 750 electrically connects the branch 755 to the input terminal 756, to transfer the signal from the printed circuit board 500f to the first semiconductor chip 100 and the second semiconductor chip 200. For example, the signal received by the input terminal 756 may be transferred to the power distribution device 700 along the signal transfer line 750. The signal is distributed to the first transfer line 710 and second transfer line 720 based on the branch 755 and transferred to the first semiconductor chip 100 and the second semiconductor chip 200. The signal transfer line 750 may include a vertical structure 754 penetrating through at least one of the insulating layers 702 and 704 and a horizontal structure 752 at the same layer level as that of the insulating layers 702 and 704.

The first transfer line 710 may electrically connect the branch 755 to the first output terminal 716. The first transfer line 710 may include a first via structure 714 penetrating through at least one of the insulating layers 702 and 704, and a first wiring pattern 712 formed at the same layer level as that of the insulating layers 702 and 704. The second transfer line 720 may electrically connect the branch 755 to the second output terminal 726. The second transfer line 720 may include a second via structure 724 penetrating through at least one of the insulating layers 702 and 704, and a second wiring pattern 722 formed at the same insulating layer between the insulating layers 702 and 704.

The first transfer line 710 and second transfer line 720 may have substantially the same lengths as each other. The lengths of the first transfer line 710 and the second transfer line 720 may be substantially equal to a quarter of the wavelength of the signal received by the input terminal 756. The first transfer line 710 and the second transfer line 720 may have substantially the same impedance as each other. The lengths and the impedance of the first transfer line 710 and the second transfer line 720 may be adjusted to satisfy conditions of the Wilkinson divider.

At least one of the first wiring pattern 712 or the second wiring pattern 722 may have zig-zags similar to the first wiring pattern 512 in FIG. 2B. In order to make the length of the first transfer line 710 substantially equal to a quarter of the wavelength of the signal transmitted from outside via the external connection terminal 600, the first wiring pattern 712 may have zig-zags. In a case where there is sufficient length or space, the first wiring pattern 712 may be straight or may have a non-zig-zag shape.

The resistor unit 740 may include a plurality of connection terminals, e.g., a first connection terminal 741 and a second connection terminal 742. The first connection terminal 741 of the resistor unit 740 may be connected to the first output terminal 716. The second connection terminal 742 of the resistor unit 740 may be connected to the second output terminal 726. For example, the resistor unit 740 may be implemented as at least one chip resistor and may be mounted so that opposite ends of the resistor unit 740 contact the first output terminal 716 and the second output terminal 726. In a case where one or more semiconductor chips are additionally mounted on the printed circuit board 500f, the resistor unit 740 may include a plurality of chip resistors that have impedance values substantially equal to one another. The impedance of the resistor unit 740 may be adjusted, for example, to satisfy the conditions of the Wilkinson divider.

Figure 12A:
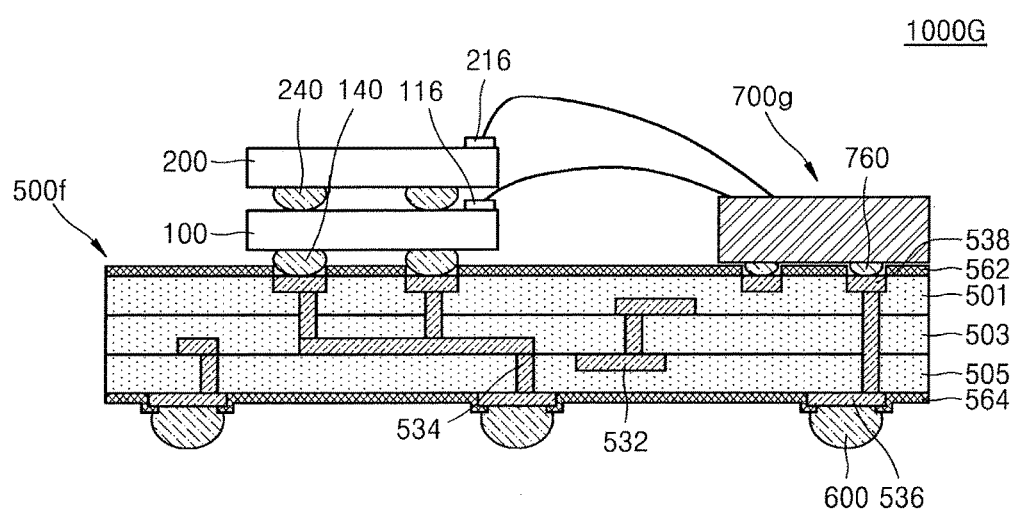
FIG. 12A illustrates another embodiment of a semiconductor package.
Figure 12B:
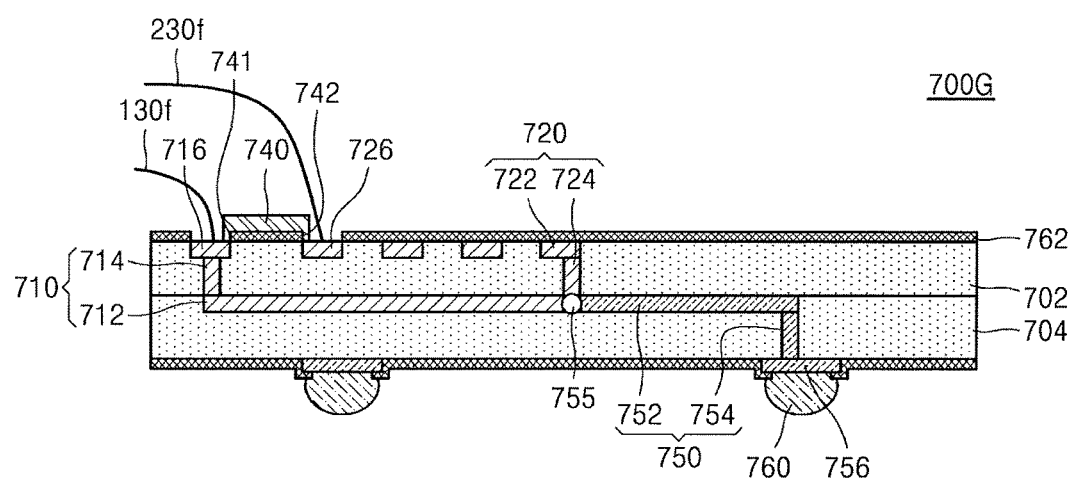
FIG. 12B illustrates another embodiment of a power distribution device.

FIG. 12A illustrates another embodiment of a semiconductor package 1000G, and FIG. 12B illustrates an embodiment of of a power distribution device 700g in the semiconductor package 1000G.

Referring to FIG. 12A, the semiconductor package 1000G may include the printed circuit board 500f, the first semiconductor chip 100, the second semiconductor chip 200, and the power distribution device 700g.

The first semiconductor chip 100 may be mounted on the printed circuit board 500f via a first bump 140. The second semiconductor chip 200 may be mounted on the first semiconductor chip 100 via a second bump 240, for example, by a flip-chip bonding method. The first semiconductor chip 100 and the second semiconductor chip 200 may be stacked as stairs or may be stacked and aligned with each other in a direction perpendicular to an upper surface of the printed circuit board 500f. In one embodiment, the first semiconductor chip 100 and the second semiconductor chip 200 may be mounted on the same plane of the printed circuit board 500f, for example, by the flip-chip bonding method. One or more semiconductor chips, in addition to the first semiconductor chip 100 and the second semiconductor chip 200, may be mounted on the printed circuit board 500f and respectively connected to the power distribution device 700g.

The power distribution device 700g may be mounted on the printed circuit board 500f, for example, by a flip-chip bonding method. The power distribution device 700g may receive a signal from the printed circuit board 500f via a bump 760 contacting the upper pad 538. The power distribution device 700g may transfer the signal from the printed circuit board 500f to the first semiconductor chip 100 and the second semiconductor chip 200. The power distribution device 700g may have, for example, a Wilkinson divider structure.

Referring to FIGS. 12A and 12B, the power distribution device 700g may include a plurality of insulating layers 702 and 704, an input terminal 756, a first output terminal 716, a second output terminal 726, a resistor unit 740, a signal transfer line 750, a first transfer line 710, a second transfer line 720, and a bump 760. Solder resist layers 762 and 764 may be respectively formed on an upper surface of the uppermost layer and a lower surface of the lowermost layer between the insulating layers 702 and 704.

The input terminal 756 receives the signal transmitted from the printed circuit board 500f via the bump 760 and transfers the signal to the signal transfer line 750. The signal may be divided at the branch 755 and transferred to the first semiconductor chip 100 and the second semiconductor chip 200.

Figure 13:
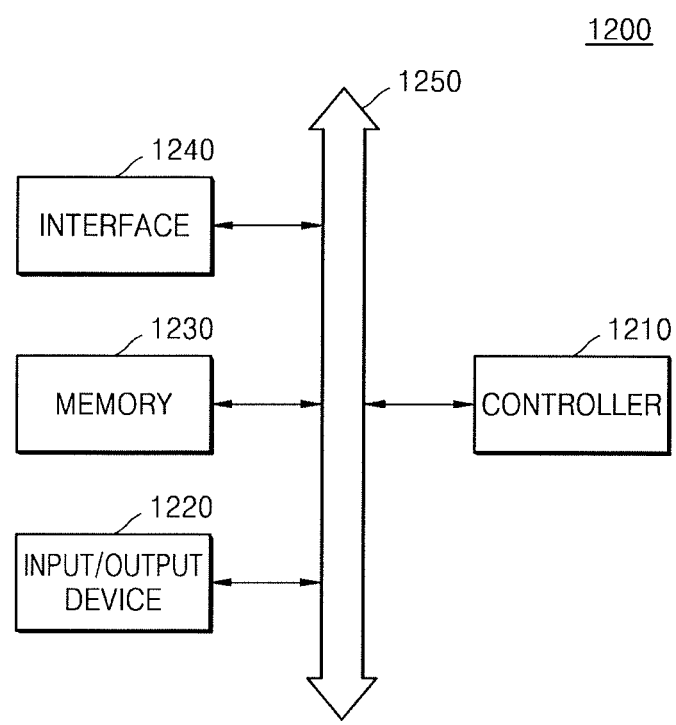
FIG. 13 illustrates an embodiment of a semiconductor package.

FIG. 13 illustrates an embodiment of a system 1200 including a semiconductor package. Referring to FIG. 13, the system 1200 includes a controller 1210, an input/output device 1220, a memory 1230, and an interface 1240. The system 1200 may be a mobile system or a system transmitting/receiving information. In some embodiments, the mobile system may include a personal digital assistant (PDA), a portable computer, a Web tablet, a wireless phone, a mobile phone, a digital music player, or a memory card.

The controller 1210 controls execution programs in the system 1200 and may include a microprocessor, a digital signal processor, a microcontroller, or a similar device. The input/output device 1220 may be used to input/output data into/from the system 1200. The system 1200 may be connected to an external device, e.g., a personal computer or network, via the input/output device 1220, and may exchange data with the external device. The input/output device 1220 may be, for example, a keypad, a keyboard, or a display.

The memory 1230 may store codes and/or data for operating the controller 1210, or data processed by the controller 1210. The memory 1230 may include a semiconductor package according to an embodiment. For example, the memory 1230 may include the semiconductor package 1000, 1000A, 1000B, 1000C, 1000D, 1000E, 1000F, or 1000G exemplarily shown in FIGS. 1 to 12A.

The interface 1240 may be a data transmission path between the system 1200 and an external device. The controller 1210, the input/output device 1220, the memory 1230, and the interface 1240 may communicate with one another via a bus 1250. The system 1200 may be used, for example, in a mobile phone, an MP3 player, a navigation system, a portable multimedia player (PMP), a solid state disk (SSD), or household appliances.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The processors, controllers, and other signal generating and signal processing features of the embodiments disclosed herein may be implemented in logic which, for example, may include hardware, software, or both. When implemented at least partially in hardware, the processors, controllers, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the processors, controllers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor package, comprising:
a printed circuit board having a lower surface and an upper surface, the upper surface including a first pad and a second pad;
an external connection terminal on the lower surface of the printed circuit board;
a resistor circuit including a first connection terminal and a second connection terminal, the first connection terminal connected to the first pad and the second connection terminal is connected to the second pad;
a first semiconductor chip mounted on the printed circuit board and connected to the first pad; and
a second semiconductor chip stacked on the first semiconductor chip and connected to the second pad,
wherein the printed circuit board includes:
a signal transfer line that connects a branch in the printed circuit board to the external connection terminal;
a first transfer line that connects the branch to the first pad; and
a second transfer line that connects the branch to the second pad.

2. The semiconductor package as claimed in claim 1, wherein:
the printed circuit board includes a plurality of layers,
the first transfer line includes:
a first via structure penetrating through at least one of the layers, and
a first wiring pattern at a same layer level of the printed circuit board, and
the second transfer line includes:
a second via structure penetrating through at least one of the layers, and
a second wiring pattern at a same layer level of the printed circuit board.

3. The semiconductor package as claimed in claim 2, wherein the first wiring pattern and the second wiring pattern are at different layers from each other.

4. The semiconductor package as claimed in claim 1, further comprising:
a third semiconductor chip mounted on the printed circuit board,
wherein the printed circuit board includes a third pad on the upper surface, wherein the resistor circuit includes a third connection terminal, and wherein the third semiconductor chip and the third connection terminal are connected to the third pad.

5. The semiconductor package as claimed in claim 1, wherein the resistor circuit includes a plurality of chip resistors having equal impedances.

6. The semiconductor package as claimed in claim 5, wherein the first semiconductor chip and the second semiconductor chip are stacked and aligned with each other in a direction perpendicular to the upper surface of the printed circuit board.

7. The semiconductor package as claimed in claim 1, wherein each of the first transfer line and the second transfer line has a length equal to a quarter of a wavelength of a signal transmitted from the external connection terminal.

8. The semiconductor package as claimed in claim 1, wherein the first transfer line and the second transfer line have equal impedances.

9. The semiconductor package as claimed in claim 1, wherein at least one of the first transfer line or the second transfer line has a zig-zag pattern.

10. A semiconductor package, comprising:
a printed circuit board including a lower surface and an upper surface, the upper surface including a first pad and a second pad;
an external connection terminal on the lower surface of the printed circuit board;
a resistor circuit including a first connection terminal and a second connection terminal, the first connection terminal connected to the first pad and the second connection terminal connected to the second pad;
a first semiconductor chip mounted on the printed circuit board and connected to the first pad; and
a second semiconductor chip mounted on the printed circuit board and connected to the second pad, the first semiconductor chip and the second semiconductor chip mounted on a same plane of the printed circuit board,
wherein the printed circuit board includes:
a signal transfer line that connects a branch in the printed circuit board to the external connection terminal;
a first transfer line that connects the branch to the first pad; and
a second transfer line that connects the branch to the second pad.

11. The semiconductor package as claimed in claim 10, wherein:
the printed circuit board includes a plurality of layers,
the first transfer line includes:
a first via structure penetrating through at least one of the layers, and
a first wiring pattern formed at a same layer level of the printed circuit board, and
the second transfer line includes:
a second via structure penetrating through at least one of the plurality of layers, and
a second wiring pattern formed at a same layer level of the printed circuit board.

12. The semiconductor package as claimed in claim 10, further comprising:
a third semiconductor chip mounted on the printed circuit board,
wherein the upper surface of the printed circuit board includes a third pad and wherein a third transfer line connects the branch to the third pad.

13. The semiconductor package as claimed in claim 12, wherein the third semiconductor chip is stacked on the second semiconductor chip.

14. The semiconductor package as claimed in claim 10, wherein the first transfer line and the second transfer line have equal impedance values.

15. The semiconductor package as claimed in claim 10, wherein each of the first transfer line and the second transfer line has a length equal to a quarter of a wavelength of a signal transmitted from the external connection terminal.

16. A semiconductor package, comprising:
a printed circuit board;
a first semiconductor chip and a second semiconductor chip mounted on the printed circuit board; and
a power distribution device mounted on the printed circuit board and including:
an input terminal to receive a signal;

a first output terminal and a second output terminal to output a signal;
a resistor circuit including a first connection terminal connected to the first output terminal and a second connection terminal connected to the second output terminal;
a signal transfer line that connects a branch in the power distribution device to the input terminal;
a first transfer line that connects the branch to the first connection terminal; and
a second transfer line that connects the branch to the second connection terminal.

17. The semiconductor package as claimed in claim 16, wherein the first semiconductor chip and the second semiconductor chip are mounted on the printed circuit board in a stacked pattern.

18. The semiconductor package as claimed in claim 16, wherein the first semiconductor chip and the second semiconductor chip are mounted on the printed circuit board based on a flip-chip bond.

19. The semiconductor package as claimed in claim 16, wherein at least one of the first transfer line or the second transfer line has a zig-zag pattern.

20. The semiconductor package as claimed in claim 16, wherein:
the power distribution device includes a plurality of layers, and
each of the first and second transfer lines includes a via structure penetrating through at least one of the layers.

* * * * *